US010784597B2

(12) United States Patent
Jones et al.

(10) Patent No.: US 10,784,597 B2
(45) Date of Patent: Sep. 22, 2020

(54) MODULAR CIRCUIT BOARD MULTI-TAP

(71) Applicant: PPC BROADBAND, INC., East Syracuse, NY (US)

(72) Inventors: Douglas Jones, Cicero, NY (US); Noah Montena, Syracuse, NY (US)

(73) Assignee: PPC BROADBAND, INC., Easy Syracuse, NY (US)

( * ) Notice: Subject to any disclaimer, the term of this patent is extended or adjusted under 35 U.S.C. 154(b) by 25 days.

(21) Appl. No.: 16/226,982

(22) Filed: Dec. 20, 2018

(65) Prior Publication Data

US 2019/0207332 A1  Jul. 4, 2019

Related U.S. Application Data

(60) Provisional application No. 62/613,484, filed on Jan. 4, 2018.

(51) Int. Cl.
| | |
|---|---|
| *H01P 5/18* | (2006.01) |
| *H03H 9/74* | (2006.01) |
| *H01R 9/05* | (2006.01) |
| *H01R 13/52* | (2006.01) |
| *H04N 7/10* | (2006.01) |
| *H01R 43/26* | (2006.01) |
| *H01R 31/02* | (2006.01) |
| *H01R 24/54* | (2011.01) |
| *H01R 24/52* | (2011.01) |

(52) U.S. Cl.
CPC ....... *H01R 9/0509* (2013.01); *H01R 13/5213* (2013.01); *H01R 24/52* (2013.01); *H01R 24/547* (2013.01); *H01R 31/02* (2013.01); *H01R 43/26* (2013.01); *H04N 7/104* (2013.01); *H01R 2201/18* (2013.01)

(58) Field of Classification Search
CPC .......... H01P 5/18; H03H 9/74; H01R 9/0509; H01R 13/5213; H01R 24/547; H01R 31/02; H01R 43/26
USPC .................................................. 333/109, 112
See application file for complete search history.

(56) References Cited

U.S. PATENT DOCUMENTS

| | | | | | |
|---|---|---|---|---|---|
| 4,578,702 | A | * | 3/1986 | Campbell, III | ........ H04N 7/104 174/59 |
| 4,963,966 | A | * | 10/1990 | Harney | ................... H04N 7/104 348/E7.053 |
| 6,133,939 | A | * | 10/2000 | Gresko | ................ H01R 24/547 725/127 |
| 6,292,371 | B1 | | 9/2001 | Toner, Jr. | |

(Continued)

OTHER PUBLICATIONS

Young, Lee W. (Authorized Officer), International Search Report and Written Opinion dated Mar. 21, 2019, PCT Application No. PCT/US2018/066723, filed Dec. 20, 2018, pp. 1-12.

*Primary Examiner* — Dean O Takaoka
(74) *Attorney, Agent, or Firm* — MH2 Technology Law Group LLP

(57) ABSTRACT

A multi-tap device for a cable television (CATV) system includes a tap housing and a first circuit board positioned within and removably connected to the tap housing. A directional coupler is connected to the first circuit board. A faceplate is integral with the tap housing. One or more subscriber tap ports are connected to the faceplate. An access cover is connected to the tap housing. The access cover is configured to be opened to provide access to an interior of the tap housing for a user to disconnect the first circuit board from the tap housing.

23 Claims, 4 Drawing Sheets

(56) References Cited

U.S. PATENT DOCUMENTS

| | | |
|---|---|---|
| 6,570,465 B2 | 5/2003 | Tang |
| 2004/0086110 A1 | 5/2004 | Singaliese et al. |
| 2005/0078918 A1* | 4/2005 | Wang .................. G02B 6/4201 |
| | | 385/92 |
| 2012/0044361 A1 | 2/2012 | Riggsby |
| 2015/0067755 A1* | 3/2015 | Conroy .................. H04N 21/41 |
| | | 725/127 |
| 2015/0130555 A1* | 5/2015 | Li ........................ H05K 5/0026 |
| | | 333/100 |
| 2015/0236460 A1* | 8/2015 | Ariesen ................. H04H 20/63 |
| | | 725/144 |
| 2017/0099100 A1 | 4/2017 | Bush et al. |
| 2020/0036938 A1* | 1/2020 | Jones .................... H04N 7/104 |

\* cited by examiner

MODULAR CIRCUIT BOARD MULTI-TAP

CROSS-REFERENCE TO RELATED APPLICATIONS

This application claims priority to U.S. Provisional Patent Application No. 62/613,484, filed on Jan. 4, 2018, the entirety of which is incorporated by reference.

BACKGROUND

In present cable television (CATV) operating systems, television and data signals are transmitted from a main source known as the "headend" to remote subscribers (e.g., at a household). The signal communication may be unidirectional (i.e., a one-way, downstream transmission from the headend to the subscriber). In such systems, the transmitted signal is generated from a single source, permitting cable operators to maintain high-quality signals for reception by the subscribers through use of tight tolerances, high-quality shielding, and forward equalization to maintain reliable transmission.

Recent advances in cable television have allowed subscribers to become interactive (i.e., to transmit upstream return signals back to the headend). As a result, many cable systems now provide an active return path. However, the signals in the return path may generate noise, and the noise aggregates from all subscribers generating return signals at a given time. The three primary sources of noise generated in the return path of a bidirectional cable television operating system are thermal noise, ingress, and fiber link noise. As a result, it is difficult to maintain a high-quality return path, because the cable operator cannot maintain any meaningful control of the return signal from each subscriber.

Multi-tap devices may provide the function of directional coupling to provide a desired level of attenuation for the signals tapped off to the subscribers. Because of this, taps are typically provided with multiple values of directional coupling based off where they are positioned in the distribution line. In addition, the multi-tap devices are now used to provide the function of equalization to reduce noise in the signals. Such multi-tap devices permit a user to select a single plug-in for providing a desired equalization function. Multi-tap devices often include a tap housing with a removable faceplate. The faceplate includes a directional coupler, a receptacle for a plug-in module, a splitter, and connections for subscriber tap ports (also known as F-ports). The removable faceplate has a printed circuit board attached permanently thereto. This allows the faceplate to be removed without interrupting the downstream signal (e.g., to the subscriber). However, this requires a technician to disconnect all of the drop-connections when the tap value needs to be changed, which represents an undesirable interruption of service. Furthermore, it requires significant additional inventory since users may need to stock all possible directional coupling values for each tap configuration.

SUMMARY

A multi-tap device for a cable television (CATV) system is disclosed. The device includes a tap housing configured to be installed at a subscriber premises. A first circuit board is connected to the tap housing. A directional coupler is connected to the first circuit board. A plug-in signal-conditioning module is connected to the first circuit board. A faceplate is connected to the tap housing. A second circuit board is connected to the faceplate and to the first circuit board. An access cover is connected to the tap housing. The access cover is configured to be opened to provide access for a user to disconnect the first circuit board from the tap housing and from the second circuit board, thereby changing a tap value of the multi-tap device. One or more subscriber tap ports are connected to the second circuit board. The one or more subscriber tap ports are configured to remain connected to one or more subscriber devices while the tap value of the multi-tap device is changed.

In another embodiment, the device includes a tap housing and a first circuit board positioned within and removably connected to the tap housing. A directional coupler is connected to the first circuit board. A faceplate is integral with the tap housing. One or more subscriber tap ports are connected to the faceplate. An access cover is connected to the tap housing. The access cover is configured to be opened to provide access to an interior of the tap housing for a user to disconnect the first circuit board from the tap housing.

A method for changing a tap value of a multi-tap device is also disclosed. The method includes opening an access cover from a tap housing to provide access to a first directional coupler (DC) circuit board in the tap housing. The method also includes disconnecting and removing the first DC circuit board from the tap housing after the access cover is opened. A first directional coupler is connected to the first DC circuit board and is removed from the tap housing together with the first DC circuit board. The method also includes connecting a second DC circuit board to the tap housing after the first DC circuit board has been disconnected and removed from the tap housing. The second DC circuit board has a different tap value than the first DC circuit board.

It will be appreciated that this summary is intended merely to introduce some aspects of the present methods, systems, and media, which are more fully described and/or claimed below. Accordingly, this summary is not intended to be limiting.

BRIEF DESCRIPTION OF THE DRAWINGS

The accompanying drawings, which are incorporated in and constitute a part of this specification, illustrate embodiments of the present teachings and together with the description, serve to explain the principles of the present teachings.

DETAILED DESCRIPTION

Embodiments of the present disclosure may provide a distribution multi-tap device that includes a tap housing (also referred to as a tap plate). A directional coupler (DC) circuit board and a tap faceplate circuit board may be connected to and/or positioned in the tap housing. The DC circuit board may be removable (i.e., it may be disconnected and separated from the tap housing and/or the tap faceplate circuit board). This may allow the tap value of the device to be changed without having to remove the existing faceplate and/or disconnect the drop connections to the subscriber tap ports.

In one embodiment, the device may include a DC circuit board that may be connected to and/or positioned in the tap housing and is removable therefrom. The DC circuit board may include one or more (e.g., two) receptacles to connect the tap housing to the DC circuit board as well as one or more (e.g., one) receptacle to connect to the DC circuit board to the tap faceplate circuit board. The DC circuit board may also include one or more (e.g., one) receptacle for a plug-in signal-conditioning module. The tap faceplate may include a circuit board with one or more splitters and one or more subscriber tap ports (also known as F-ports). The tap faceplate circuit board may include a pin connection and/or a receptacle to accept a patch cord to connect the tap faceplate circuit board to the DC circuit board.

In another embodiment, the device may include a (e.g., DC) circuit board that may be connected to and/or positioned in the tap housing and is removable therefrom. The circuit board may include one or more (e.g., two) receptacles to connect to the tap housing to the circuit board as well as one or more (e.g., one) multi-pin receptacle to connect the circuit board to the tap faceplate circuit board. The circuit board may include a receptacle for a plug-in signal-conditioning module. The tap faceplate circuit board may include a pin connection and/or a receptacle to accept a patch cord to connect the faceplate circuit board to the circuit board. Splitting/separating the tap faceplate from the circuit board may provide benefits to the installer when changing tap values.

Figure 1:
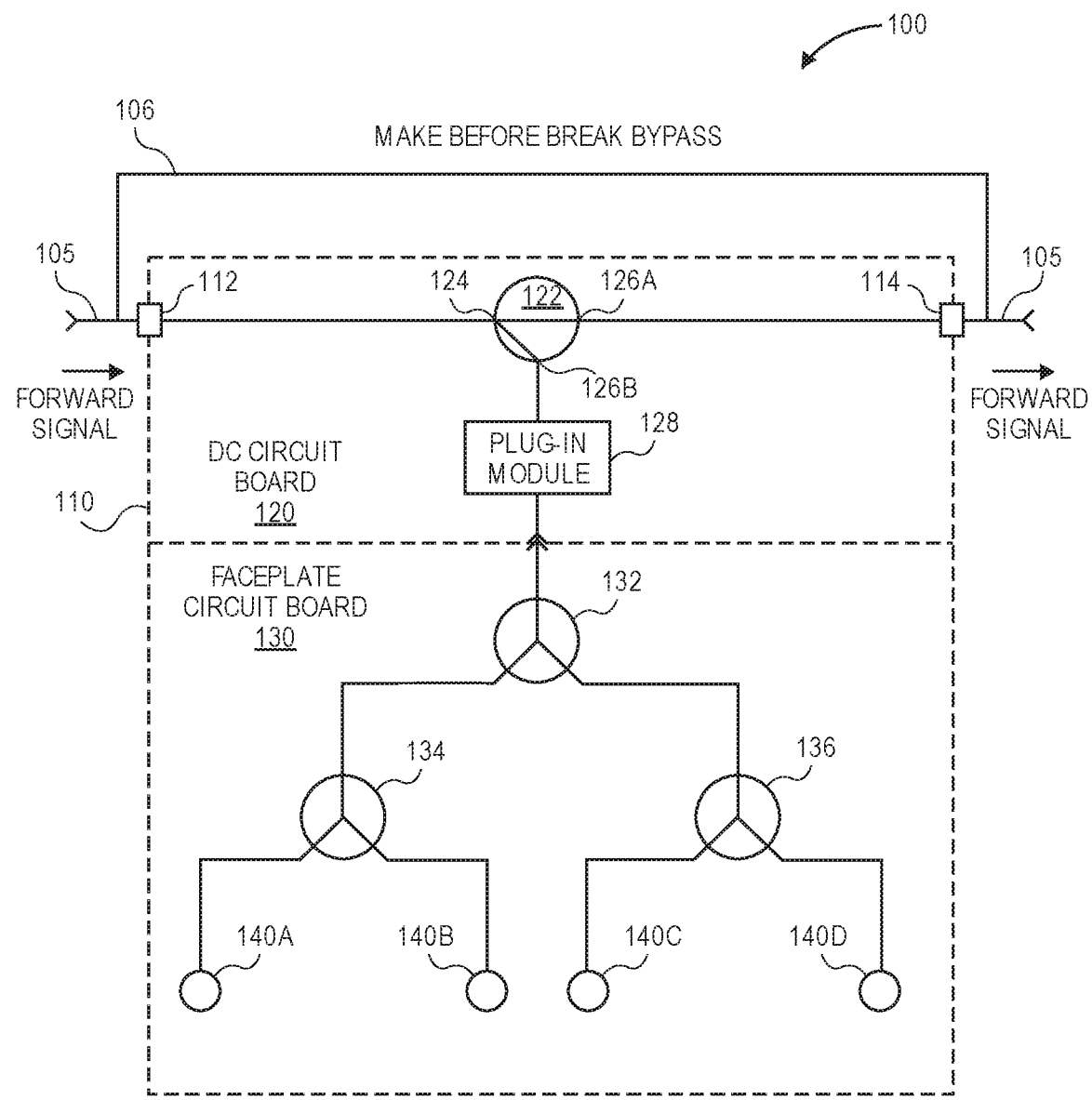
FIG. 1 illustrates a circuit diagram of a multi-tap device for a cable television (CATV) system, according to an embodiment.

FIG. 1 illustrates a circuit diagram of a multi-tap device 100 for a cable television (CATV) system, according to an embodiment. The device 100 may include a tap housing (also referred to as a tap plate) 110. The tap housing 110 may include one or more KS ports (e.g., an input port 112 and an output port 114). The input port 112 may be configured to connect to an upstream portion of a line 105 from a CATV source (e.g., the headend). The output port 114 may be configured to connect to a downstream portion of the line 105 to enable the signals to continue downstream. In at least one embodiment, a make-before-break bypass 106 may be connected to the ports 112, 114 and provide an alternate path around the multi-tap device 100.

A DC circuit board 120 may be removably connected to (i.e., configured to be disconnected from) and/or positioned in the tap housing 110. The DC circuit board 120 may be configured to be disconnected and/or removed from the tap housing 110, as described in greater detail below. The DC circuit board 120 may have a directional coupler 122 connected thereto to provide a desired level of attenuation for the signals tapped off to the subscribers. The directional coupler 122 may have one or more input ports (one is shown: 124) and one or more output ports (two are shown: 126A, 126B). The input port 124 may be configured to connect to the input port 112 of the tap housing 110 to enable the directional coupler 122 to receive signals from the CATV source. The first output port 126A may be configured to connect to the output port 114 of the tap housing 110 to enable the signals to continue downstream. The second output port 126B may be configured to connect to a plug-in module 128.

The plug-in module 128 may be configured to plug-in or otherwise connect to a receptacle in the DC circuit board 120. In another embodiment, the plug-in module 128 may include receptacles that may receive contacts on the DC circuit board 120. The plug-in module 128 may be configured to condition the signals passing therethrough. More particularly, the plug-in module 128 may be configured to equalize and/or filter the signals passing therethrough in one or both directions.

A tap faceplate circuit board 130 may also be connected to and/or positioned in the tap housing 110. The tap faceplate circuit board 130 may also be connected to the DC circuit board 120. The tap faceplate circuit board 130 may include one or more splitters (three are shown: 132, 134, 136). The first splitter 132 may be configured to connect to the directional coupler circuit board 120. More particularly, the first splitter 132 may be configured to connect to the plug-in module 128. The first splitter 132 may also be configured to connect to the second and third splitters 134, 136. The second splitter 134 may be configured to connect to one or more subscriber tap ports (two are shown: 140A, 140B). Similarly, the third splitter 136 may be configured to connect to one or more subscriber tap ports (two are shown: 140C, 140D).

Figure 2:
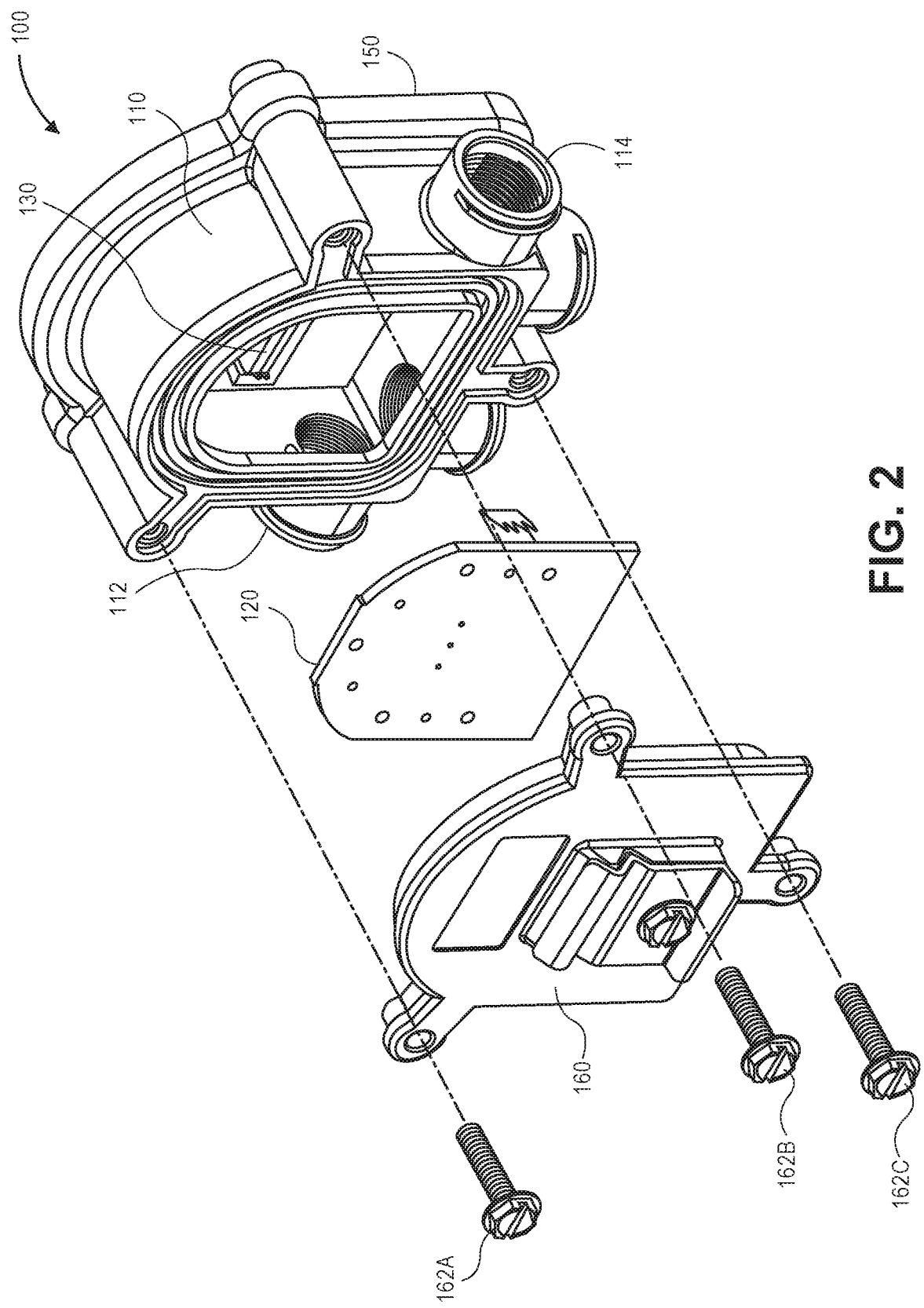
FIG. 2 and FIG. 3 illustrate exploded perspective views of the multi-tap device, according to an embodiment.
Figure 3:
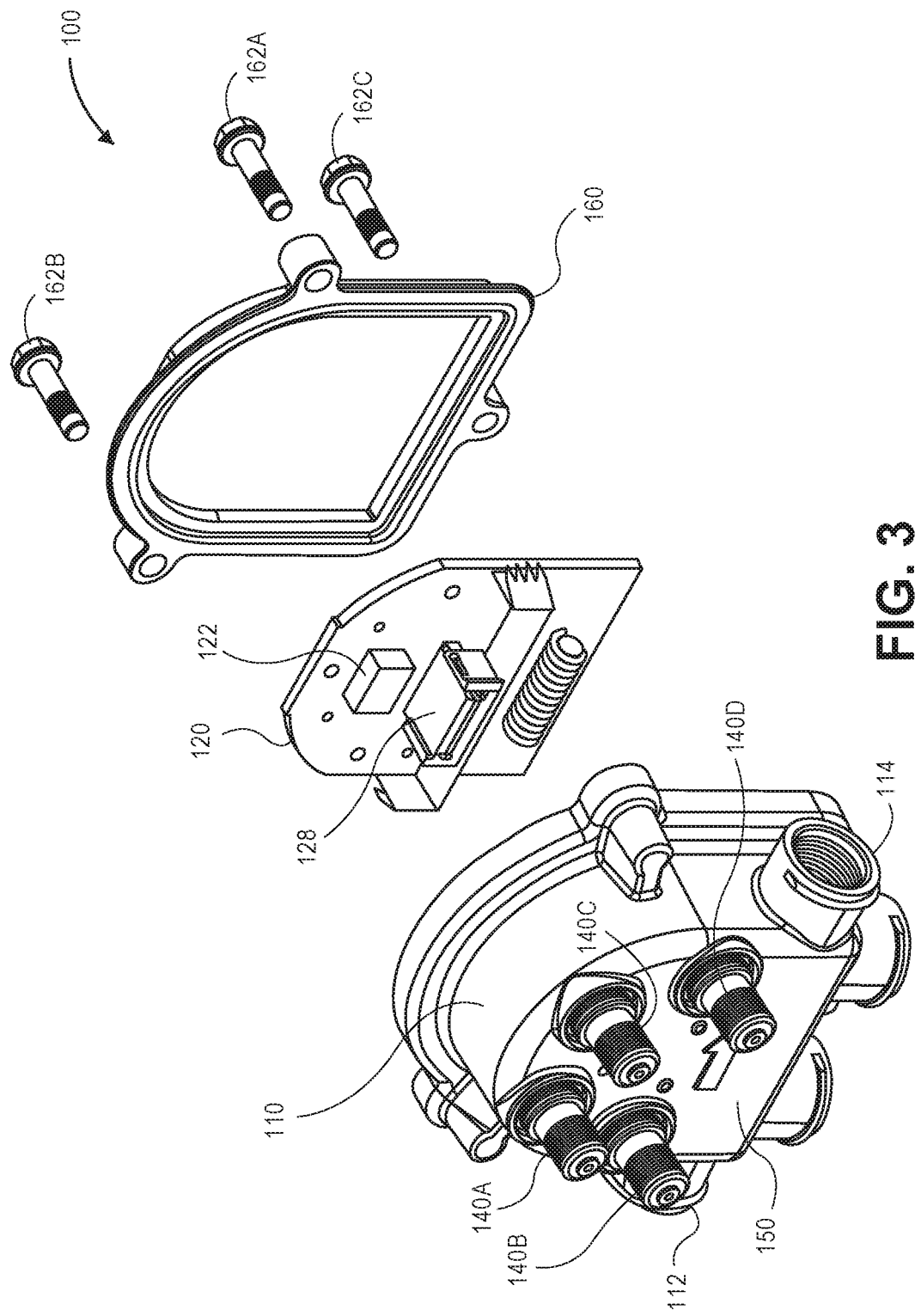

FIGS. 2 and 3 illustrate exploded views of the multi-tap device 100, according to an embodiment. As described above, the device 100 may include the tap housing 110, the DC circuit board 120, the plug-in module 128, the tap faceplate circuit board 130, and the subscriber tap ports 140A-D. The device 100 may also include a faceplate 150. In at least one embodiment, the faceplate 150 may be integral with the tap housing 110. Thus, the faceplate 150 may be referred to as non-removable with respect to (i.e., not configured to be disconnected from) the tap housing 110. The subscriber tap ports 140A-D may be mounted directly to the tap housing 110. More particularly, the subscriber tap ports 140A-D may be mounted directly to the faceplate 150.

The device 100 may also include an access cover 160 that is positioned on an opposing side of the tap housing 110 from the faceplate 150. The access cover 160 may be connected to the tap housing 110 via a plurality of fasteners (three are shown: 162A-C), e.g., screws, bolts, etc. In this embodiment, once the fasteners 162A-C are removed, the access cover 160 may be disconnected and moved laterally-away from the tap housing 110 to provide access to the components therein. In another embodiment, rather than using fasteners 162A-C, the access cover 160 may be secured in the closed state via a snap-fit arrangement, a tongue-in-groove arrangement, or the like with the tap housing 110.

Figure 4:
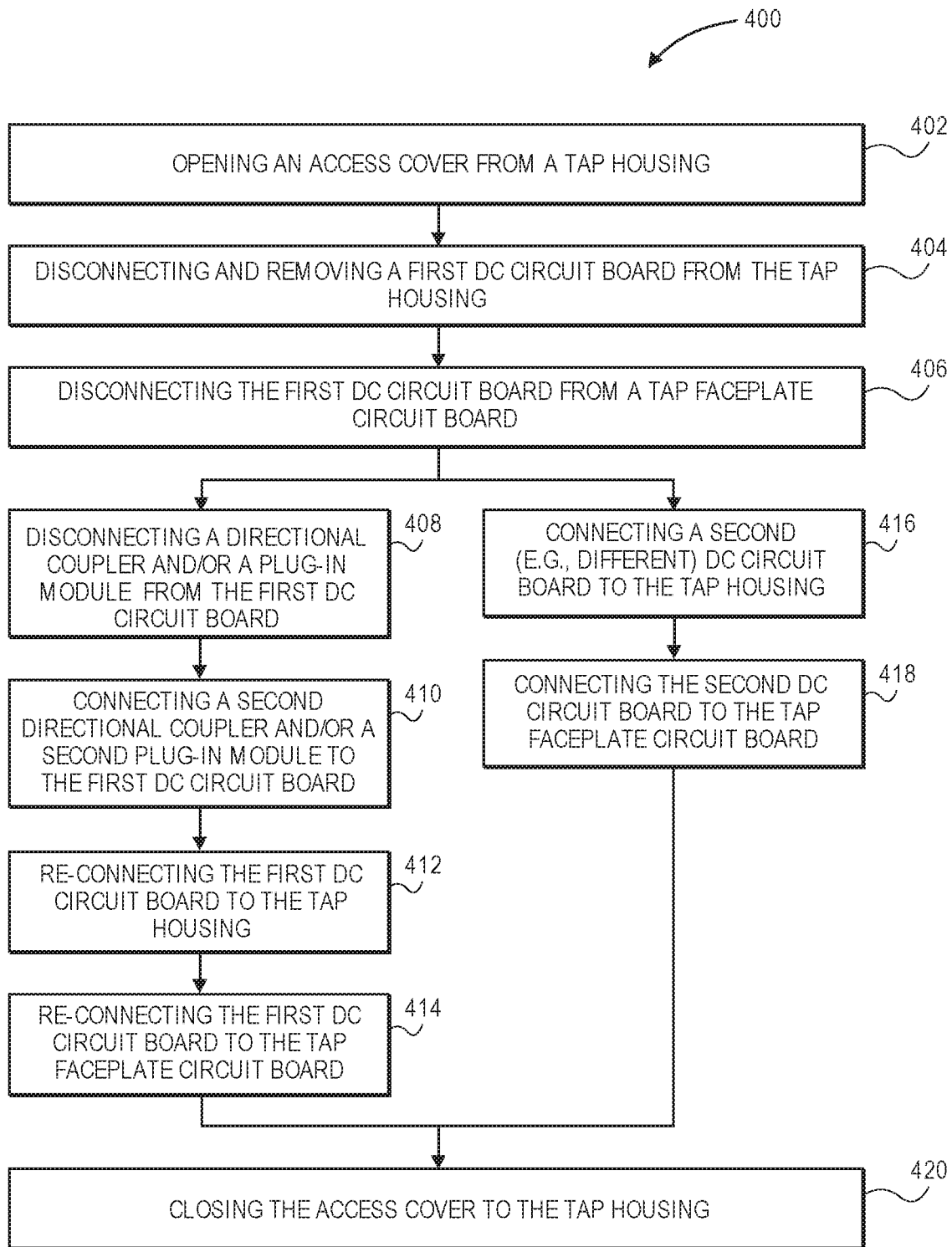
FIG. 4 illustrates a flowchart of a method for changing a tap value of the multi-tap device, according to an embodiment.

FIG. 4 illustrates a flowchart of a method 400 for changing a tap value of the multi-tap device 100, according to an embodiment. The method 400 may include opening the access cover 160 from the tap housing 110, as at 402. As will be appreciated, the faceplate 150 (with the subscriber tap ports 140A-D mounted thereon) may remain connected to or integral with the tap housing 110 when the access cover 160 is opened. As shown, opening the access cover 160 may include disconnecting and/or removing the access cover 160 from the tap housing 110. In another embodiment, the access cover 160 may be connected to the tap housing 110 by one or more hinges, and the access cover 160 may pivot around the hinge(s) to open the access cover 160.

Once the access cover 160 is opened, the method 400 may include disconnecting and removing a first DC circuit board 120 from the tap housing 110, as at 404. The bypass 106 may be active during this step to avoid interrupting downstream communication. In at least one embodiment, the first DC circuit board 120 may have a first directional coupler 122 and/or a first plug-in module 128 connected thereto when removed from the tap housing 110. In another embodiment, the first directional coupler 122 and/or the first plug-in module 128 may be disconnected from the first DC circuit board 120 and remain in the tap housing 110 when the first DC circuit board 120 is removed.

The method 400 may also include disconnecting the first DC circuit board 120 from the tap faceplate circuit board 130, as at 406. The first DC circuit board 120 may be disconnected from the tap faceplate circuit board 130 before, simultaneously with, or after it is disconnected from the tap housing 110. The tap faceplate circuit board 130 may remain connected to and/or positioned in the tap housing 110 when the first DC circuit board 120 is disconnected and removed.

When the first directional coupler 122 and/or the first plug-in module 128 are removed together with the first DC circuit board 120, the method 400 may also include disconnecting the first directional coupler 122 and/or the first plug-in module 128 from the first DC circuit board 120, as at 408. The method 400 may also include connecting a second directional coupler and/or a second plug-in module to the first DC circuit board 120, as at 410. The second directional coupler and/or the second plug-in module may be similar to the first directional coupler 122 and/or the first plug-in module 128 described above; however, the second directional coupler and/or the second plug-in module, when connected to the first DC circuit board 120, may change the tap value of the first DC circuit board 120.

The method 400 may also include re-connecting the first DC circuit board 120 (with the second directional coupler and/or the second plug-in module connected thereto) to the tap housing 110, as at 412. The method 400 may also include re-connecting the first DC circuit board 120 (with the second directional coupler and/or the second plug-in module connected thereto) to the tap faceplate circuit board 130, as at 414.

In an alternative embodiment to steps 408-414, the method 400 may include connecting a second (e.g., different) DC circuit board to the tap housing 110, as at 416. The method 400 may also include connecting the second DC circuit board to the tap faceplate circuit board 130, as at 418. The second DC circuit board may be similar to the first DC circuit board 120 described above; however, the second DC circuit board may have a different tap value (e.g., may condition signals differently) than the first DC circuit board 120. In at least one embodiment, the second DC circuit board may have the first directional coupler 122 and/or the first plug-in module 128 connected thereto. In another embodiment, the second DC circuit board may have the second (e.g., different) directional coupler and/or the second (e.g., different) plug-in module connected thereto, which may at least partially cause the second DC circuit board to have a different tap value than the first DC circuit board 120.

The method 400 may also include closing and/or re-connecting the access cover 160 to the tap housing 110, as at 420. The access cover 160 may be closed and/or re-connected after the first DC circuit board is re-connected (e.g., at steps 412, 414) or after the second DC circuit board is connected (e.g., at steps 416, 418). Any combination of the steps described above may be performed without disconnecting connections between the subscriber tap ports 140A-D and one or more subscriber devices, due to the ability to remove the access cover 160 and the first DC circuit board 120 while the faceplate 150 remains stationary. In other words, the connections to the subscriber tap ports 140A-D may remain intact throughout any combination of the steps. This is in contrast to conventional multi-tap devices, where connections to the subscriber tap ports are disconnected when the tap value is changed.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims. The present disclosure is not to be limited in terms of the particular embodiments described in this application, which are intended as illustrations of various aspects. Many modifications and variations can be made without departing from its spirit and scope, as will be apparent to those skilled in the art. Functionally equivalent apparatuses within the scope of the disclosure, in addition to those enumerated herein will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." In addition, where features or aspects of the disclosure are described in terms of Markush groups, those skilled in the art will recognize that the disclosure is also thereby described in terms of any individual member or subgroup of members of the Markush group.

What is claimed is:

1. A multi-tap device for a cable television (CATV) system, comprising:
    a tap housing configured to be installed at a subscriber premises;
    a first circuit board connected to the tap housing;
    a directional coupler connected to the first circuit board;
    a plug-in signal-conditioning module connected to the first circuit board;
    a faceplate connected to the tap housing;
    a second circuit board connected to the faceplate and to the first circuit board;
    an access cover connected to the tap housing, wherein the access cover is configured to be opened to provide access for a user to disconnect the first circuit board from the tap housing and from the second circuit board and to subsequently remove the first circuit board from the tap housing, thereby changing a tap value of the multi-tap device, and wherein the second circuit board remains connected to the faceplate and positioned within the tap housing when the first circuit board is removed from the tap housing; and
    one or more subscriber tap ports connected to the faceplate and the second circuit board, wherein the one or more subscriber tap ports are configured to remain connected to one or more subscriber devices while the tap value of the multi-tap device is changed.

2. The multi-tap device of claim 1, wherein the faceplate is integral with the tap housing.

3. The multi-tap device of claim 2, wherein the access cover is positioned on an opposing side of the tap housing from the faceplate.

4. The multi-tap device of claim 3, wherein the directional coupler comprises:
    an input port configured to be connected to an upstream portion of a line;
    a first output port configured to be connected to a downstream portion of the line; and
    a second output port configured to be connected to the plug-in signal-conditioning module.

5. The multi-tap device of claim 4, wherein the second circuit board comprises:
    a first splitter configured to be connected to the plug-in signal-conditioning module; and
    a second splitter configured to be connected to the first splitter and to the one or more subscriber tap ports.

6. The multi-tap device of claim 5, further comprising a bypass that provides an alternate path for the line around the directional coupler.

7. The multi-tap device of claim 1, wherein the second circuit board is connected to an inner side of the faceplate, wherein the one or more subscriber tap ports are connected to an outer side of the faceplate, and wherein the faceplate is integral with the tap housing.

8. The multi-tap device of claim 1, wherein the second circuit board comprises a splitter that remains connected to the one or more subscriber tap ports when the first circuit board is removed from the tap housing.

9. The multi-tap device of claim 1, wherein the second circuit board comprises a splitter that is disconnected from the first circuit board when the first circuit board is removed from the tap housing.

10. A multi-tap device for a cable television (CATV) system, comprising:
    a tap housing;
    a first circuit board positioned within and removably connected to the tap housing;
    a directional coupler connected to the first circuit board;
    a faceplate integral with the tap housing;
    a second circuit board connected to an inner surface of the faceplate such that the second circuit board is positioned within the tap housing;
    one or more subscriber tap ports connected to the faceplate; and
    an access cover connected to the tap housing, wherein the access cover is configured to be opened to provide access to an interior of the tap housing for a user to disconnect and remove the first circuit board from the tap housing, and wherein the second circuit board remains connected to the faceplate and positioned within the tap housing when the first circuit board is removed from the tap housing.

11. The multi-tap device of claim 10, wherein the first circuit board is configured to be disconnected from the tap housing without disconnecting connections between the one or more subscriber tap ports and one or more subscriber devices.

12. The multi-tap device of claim 11, wherein the faceplate is non-removable from the tap housing.

13. The multi-tap device of claim 12, wherein the faceplate is positioned opposite to the access cover, such that the faceplate and the access cover face each other.

14. The multi-tap device of claim 13, further comprising a plug-in signal-conditioning module removably connected to the first circuit board.

15. The multi-tap device of claim 14, wherein the directional coupler comprises:
    an input port configured to be connected to an upstream portion of a line;
    a first output port configured to be connected to a downstream portion of the line; and
    a second output port configured to be connected to the plug-in signal-conditioning module.

16. The multi-tap device of claim 15, wherein the second circuit board is connected to the first circuit board when the first circuit board is positioned within the tap housing, wherein the second circuit board comprises one or more splitters.

17. The multi-tap device of claim 16, wherein the one or more splitters comprise:
    a first splitter configured to be connected to the plug-in signal-conditioning module; and
    a second splitter configured to be connected to the first splitter and to the one or more subscriber tap ports.

18. A method for changing a tap value of a multi-tap device, the multi-tap device comprising a tap housing, a first directional coupler, a tap faceplate circuit board, and an access cover, the method comprising:

opening the access cover from the tap housing to provide access to a first directional coupler (DC) circuit board in the tap housing;

disconnecting and removing the first DC circuit board from the tap housing after the access cover is opened, wherein a first directional coupler is connected to the first DC circuit board and is removed from the tap housing together with the first DC circuit board, wherein the tap faceplate circuit board remains positioned within the tap housing when the first DC circuit board is removed from the housing; and connecting a second DC circuit board to the tap housing and the tap faceplate circuit board after the first DC circuit board has been disconnected and removed from the tap housing, wherein the second DC circuit board has a different tap value than the first DC circuit board.

19. The method of claim 18, wherein the access cover is connected to an opposing side of the tap housing from a faceplate, and wherein the one or more subscriber tap ports are mounted on the faceplate.

20. The method of claim 19, wherein the faceplate is integral with the tap housing.

21. The method of claim 20, further comprising disconnecting the first DC circuit board from the tap faceplate circuit board, wherein the tap faceplate circuit board remains connected to the faceplate while the first DC circuit board is disconnected from the tap housing and the tap faceplate circuit board, and wherein the tap faceplate circuit board is connected to the one or more subscriber tap ports.

22. The method of claim 21, further comprising:

disconnecting the first directional coupler or a first plug-in signal-conditioning module from the first DC circuit board; and connecting the first directional coupler or the first plug-in signal-conditioning module to the second DC circuit board prior to connecting the second DC circuit board to the tap housing.

23. The method of claim 21, wherein the second DC circuit board has a second directional coupler connected thereto that is different than the first directional coupler, and wherein the second DC circuit board has a second plug-in signal-conditioning module connected thereto that is different than the first plug-in signal-conditioning module.

* * * * *